US008260448B2

(12) United States Patent
Ferren et al.

(10) Patent No.: US 8,260,448 B2
(45) Date of Patent: Sep. 4, 2012

(54) SYSTEM FOR IMAGING ITEMS PRODUCED BY RAPID PROTOTYPING

(75) Inventors: Bran Ferren, Beverly Hills, CA (US); Edward K. Y. Jung, Bellevue, WA (US); Clarence T. Tegreene, Bellevue, WA (US)

(73) Assignee: The Invention Science Fund I, LLC, Bellevue, WA (US)

( * ) Notice: Subject to any disclaimer, the term of this patent is extended or adjusted under 35 U.S.C. 154(b) by 231 days.

(21) Appl. No.: 12/592,217

(22) Filed: Nov. 19, 2009

(65) Prior Publication Data

US 2010/0076582 A1 Mar. 25, 2010

Related U.S. Application Data

(60) Division of application No. 11/901,202, filed on Sep. 14, 2007, now Pat. No. 7,664,563, and a continuation-in-part of application No. 10/909,132, filed on Jul. 30, 2004, and a continuation-in-part of application No. 10/884,760, filed on Jul. 2, 2004, now abandoned, and a continuation-in-part of application No. 10/892,755, filed on Jul. 16, 2004, and a continuation-in-part of application No. 10/892,974, filed on Jul. 16, 2004, and a continuation-in-part of application No. 10/802,106, filed on Mar. 16, 2004, now Pat. No. 7,806,339.

(51) Int. Cl.
*G06F 19/00* (2006.01)
(52) U.S. Cl. .......... 700/119; 700/98; 700/118; 700/163; 264/512; 264/516; 382/154; 345/419; 345/420
(58) Field of Classification Search .............. 700/97–98, 700/163, 118–119; 703/1–2; 382/154; 264/512, 264/516; 345/419–420
See application file for complete search history.

(56) References Cited

U.S. PATENT DOCUMENTS

| 3,860,796 A | 1/1975 | Wallace et al. |
| 4,806,102 A | 2/1989 | Pedersen et al. |
| 4,929,402 A * | 5/1990 | Hull .............................. 264/401 |
| 5,109,589 A | 5/1992 | Cramer et al. |
| 5,296,691 A | 3/1994 | Waldron et al. |

(Continued)

OTHER PUBLICATIONS

CADCAM NET, An Information Service of CAD/CAM Publishing; "Applications—How Rapid Prototyping Is Used in Manufacturing, Medicine, Art, and Architecture," http://www.cadcamnet.com/Sections/rapid%20prototyping/Applications.htm; printed on Mar. 4, 2004, pp. 1-6.

(Continued)

*Primary Examiner* — Ramesh Patel
(74) *Attorney, Agent, or Firm* — Suiter Swantz pc llo

(57) ABSTRACT

A system for imaging one or more items produced by rapid prototyping may include, but is not limited to: control electronics including a memory containing a plurality of data sets representing design items; a user interface coupled to the control electronics and operative to select one or more of the data sets representing design items and operative to receive user view selections; a rapid prototyping device coupled to the control electronics and responsive to the selected one or more data sets representing design items to produce physical items; a positioning mechanism operable to accept the produced physical items from the rapid prototyping device and to position the produced physical items in a field; and an image capture device responsive to the received user view selections electronics to selectively image at least a portion of the field corresponding to the received user view selection.

9 Claims, 6 Drawing Sheets

U.S. PATENT DOCUMENTS

| | | | | |
|---|---|---|---|---|
| 5,552,995 | A * | 9/1996 | Sebastian | 700/97 |
| 5,601,431 | A | 2/1997 | Howard | |
| 5,666,712 | A * | 9/1997 | Cvetkov | 29/458 |
| 5,684,713 | A | 11/1997 | Asada et al. | |
| 5,755,072 | A | 5/1998 | Lingafelter | |
| 5,988,862 | A * | 11/1999 | Kacyra et al. | 703/6 |
| 6,249,600 | B1 | 6/2001 | Reed et al. | |
| 6,405,095 | B1 * | 6/2002 | Jang et al. | 700/118 |
| 6,460,594 | B1 | 10/2002 | Lam | |
| 6,575,218 | B1 | 6/2003 | Burns et al. | |
| 6,623,687 | B1 * | 9/2003 | Gervasi et al. | 264/401 |
| 6,633,789 | B1 | 10/2003 | Nikolskiy et al. | |
| 6,654,656 | B2 * | 11/2003 | Kesavadas et al. | 700/119 |
| 6,665,574 | B2 * | 12/2003 | Farren | 700/120 |
| 6,671,866 | B2 | 12/2003 | Arsintescu | |
| 6,691,764 | B2 | 2/2004 | Embert et al. | |
| 6,701,390 | B2 | 3/2004 | Ehmann | |
| 6,807,290 | B2 * | 10/2004 | Liu et al. | 382/118 |
| 6,867,769 | B1 * | 3/2005 | Toriya et al. | 345/420 |
| 6,868,347 | B2 | 3/2005 | Li et al. | |
| 6,915,178 | B2 | 7/2005 | O'Brien et al. | |
| 6,976,627 | B1 | 12/2005 | Culp et al. | |
| 6,982,115 | B2 * | 1/2006 | Poulos et al. | 428/195.1 |
| 6,993,456 | B2 * | 1/2006 | Brooks et al. | 702/183 |
| 7,044,373 | B1 | 5/2006 | Garber et al. | |
| 7,075,531 | B1 * | 7/2006 | Ando et al. | 345/420 |
| 7,139,685 | B2 | 11/2006 | Bascle et al. | |
| 7,277,572 | B2 | 10/2007 | MacInnes et al. | |
| 7,818,148 | B2 * | 10/2010 | Carey | 703/2 |
| 2001/0056309 | A1 * | 12/2001 | Jain et al. | 700/98 |
| 2002/0010526 | A1 | 1/2002 | Ando et al. | |
| 2002/0120356 | A1 * | 8/2002 | Takahashi et al. | 700/98 |
| 2002/0147521 | A1 * | 10/2002 | Mok et al. | 700/159 |
| 2002/0186216 | A1 | 12/2002 | Baumberg et al. | |
| 2003/0218607 | A1 * | 11/2003 | Baumberg | 345/419 |
| 2004/0002841 | A1 | 1/2004 | Mayuzumi et al. | |
| 2004/0253562 | A1 * | 12/2004 | Knopp | 433/24 |
| 2005/0043835 | A1 | 2/2005 | Christensen | |
| 2005/0093713 | A1 | 5/2005 | Orme | |
| 2005/0206500 | A1 | 9/2005 | Ferren et al. | |
| 2006/0012081 | A1 | 1/2006 | Ferren et al. | |
| 2006/0025878 | A1 | 2/2006 | Ferren et al. | |
| 2006/0031044 | A1 | 2/2006 | Ferren et al. | |
| 2006/0031252 | A1 | 2/2006 | Ferren et al. | |

OTHER PUBLICATIONS

Castle Island Company; "Castle Island's Worldwide Guide to Rapid Prototyping"; http://www.home.att.net/~castleisland/; bearing dates of: Jul. 30, 2003 and Feb. 23, 2004; printed on Mar. 4, 2004, pp. 1-3.

Palm, William; "Rapid Prototyping" from Penn State Learning Factory; http://www.me.psu.edu/lamancusa/rapidpro/primer/chapter2.htm; bearing dates of: May 1998 and Jul. 30, 2002; printed on Mar. 4, 2004, pp. 1-15.

PCT International Search Report from International Application No. PCT/US05/22883 dated Aug. 1, 2008 (4 pages total).

* cited by examiner

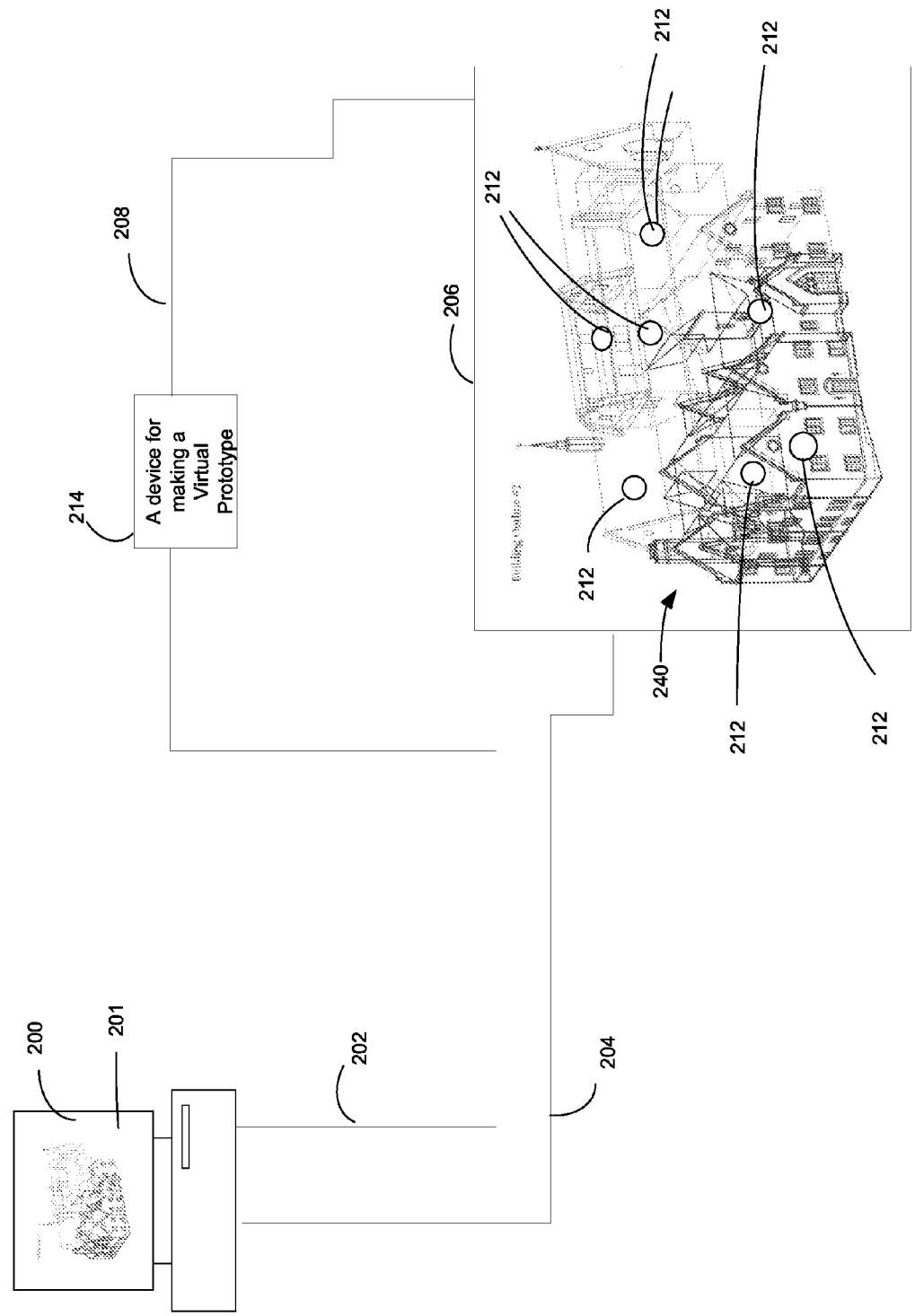

SYSTEM FOR IMAGING ITEMS PRODUCED BY RAPID PROTOTYPING

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)). All subject matter of the Related Applications and of any and all parent, grandparent, great-grandparent, etc. applications of the Related Applications is incorporated herein by reference to the extent such subject matter is not inconsistent herewith.

RELATED APPLICATIONS

For purposes of the USPTO extra-statutory requirements, the present application constitutes a continuation-in-part of U.S. patent application Ser. No. 11/901,202, entitled A SYSTEM FOR MAKING CUSTOM PROTOTYPES, naming Bran Ferren, Edward K.Y. Jung and Clarence T. Tegreene, as inventors, filed 14 Sep. 2007, now U.S. Pat. No. 7,664,563, or is an application of which is entitled to the benefit of the filing date.

For purposes of the USPTO extra-statutory requirements, the present application constitutes a continuation-in-part of U.S. patent application Ser. No. 10/909,132 entitled INTERIOR DESIGN USING RAPID PROTOTYPING, naming Bran Ferren and Clarence T. Tegreene, as inventors, filed 30 Jul. 2004, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 10/884,760, entitled A SYSTEM FOR MAKING CUSTOM PROTOTYPES, naming Bran Ferren, Edward K.Y. Jung and Clarence T. Tegreene, as inventors, filed 2 Jul. 2004, now abandoned, or is an application of which is entitled to the benefit of the filing date.

For purposes of the USPTO extra-statutory requirements, the present application constitutes a continuation-in-part of U.S. patent application Ser. No. 10/892,755, entitled CUSTOM PROTOTYPING, naming Bran Ferren, Edward K.Y. Jung and Clarence T. Tegreene, as inventors, filed 16 Jul. 2004, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 10/892,974, entitled PERSONALIZED PROTOTYPING, naming Bran Ferren, Edward K.Y. Jung and Clarence T. Tegreene, as inventors, filed 16 Jul. 2004, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 10/802,106, entitled INTERIOR DESIGN USING RAPID PROTOTYPING, naming Bran Ferren and Clarence T. Tegreene, as inventors, filed Mar. 16, 2004, now U.S. Pat. No. 7,806,339, or is an application of which is entitled to the benefit of the filing date.

The United States Patent Office (USPTO) has published a notice to the effect that the USPTO's computer programs require that patent applicants reference both a serial number and indicate whether an application is a continuation or continuation-in-part. Stephen G. Kunin, Benefit of Prior-Filed Application, USPTO Official Gazette Mar. 18, 2003, available at http://www.uspto.gov/web/offices/com/sol/og/2003/week11/patbene.htm. The present Applicant Entity (hereinafter "Applicant") has provided above a specific reference to the application(s) from which priority is being claimed as recited by statute. Applicant understands that the statute is unambiguous in its specific reference language and does not require either a serial number or any characterization, such as "continuation" or "continuation-in-part," for claiming priority to U.S. patent applications. Notwithstanding the foregoing, Applicant understands that the USPTO's computer programs have certain data entry requirements, and hence Applicant is designating the present application as a continuation-in-part of its parent applications as set forth above, but expressly points out that such designations are not to be construed in any way as any type of commentary and/or admission as to whether or not the present application contains any new matter in addition to the matter of its parent application(s).

All subject matter of the Related Applications and of any and all parent, grandparent, great-grandparent, etc. applications of the Related Applications is incorporated herein by reference to the extent such subject matter is not inconsistent herewith.

This application claims benefit of several co-pending United States applications under 35 USC §120 as described in the instant application, including U.S. application Ser. No. 10/884,760, titled A System for Making Custom Prototypes filed on Jul. 2, 2004.

TECHNICAL FIELD

The present application relates, in general, to making or customizing prototypes.

SUMMARY

In one aspect, a system includes but is not limited to: a device fabricator responsive to input data to make a prototype; one or more image capture devices alignable to said device fabricator; a database including data representing one or more forms in communication with said device fabricator; and a positioning device coupled to said one or more image capture devices and responsive to user commands to move said one or more image capture devices to capture user selected views of said prototype. In addition to the foregoing, other system aspects are described in the claims, drawings, and text forming a part of the present application.

In one aspect, a method includes but is not limited to: providing a device operable for forming an arrangement of one or more parts; providing one or more image capture device for providing at least one representation of said arrangement of one or more parts; providing a positioning system operative to align one or more image capture devices to said arrangement of one or more parts; providing a user access to said at least one representation; and providing said user access to a database comprising forms for placing in proximity to said arrangement of parts. In addition to the foregoing, other method aspects are described in the claims, drawings, and text forming a part of the present application.

In another aspect, a method includes but is not limited to: making an arrangement of one or more pieces; positioning one or more objects operable for providing at least one representation of said arrangement of one or more pieces; capturing said at least one representations of said arrangement of one or more pieces; and placing one or more forms from a database comprising forms in proximity to said arrangement of one or more pieces. In addition to the foregoing, other method aspects are described in the claims, drawings, and text forming a part of the present application.

In another aspect, a system includes but is not limited to: a pattern forming tool generating an archetype; a device for capturing at least one representation of said archetype said device communicable with said pattern forming tool; a user interface in connection with said pattern forming tool and with said device for capturing at least one representation of said archetype and displaying said view of said archetype; a storage medium operably linked to said user interface available for arranging an object from said storage medium in proximity to said archetype; and a software, a logic, or a processing unit in communication with said user interface operable for influencing said pattern comprising a plurality of members and said device for capturing at least one representation.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

In addition to the foregoing, various other method and or system aspects are set forth and described in the text (e.g., claims and/or detailed description) and/or drawings of the present application.

The foregoing is a summary and thus contains, by necessity; simplifications, generalizations and omissions of detail; consequently, those skilled in the art will appreciate that the summary is illustrative only and is NOT intended to be in any way limiting. Other aspects, inventive features, and advantages of the devices and/or processes described herein, as defined solely by the claims, will become apparent in the non-limiting detailed description set forth herein.

BRIEF DESCRIPTION OF THE FIGURES

FIG. 6 is a plan view of another aspect of the system for making custom prototypes 200.

The use of the same symbols in different drawings typically indicates similar or identical items.

DETAILED DESCRIPTION

The present application uses formal outline headings for clarity of presentation. However, it is to be understood that the outline headings are for presentation purposes, and that different types of subject matter may be discussed throughout the application (e.g., device(s)/structure(s) may be described under the process(es)/operations heading(s) and/or process(es)/operations may be discussed under structure(s)/process(es) headings). Hence, the use of the formal outline headings is not intended to be in any way limiting.

1. A System for Making Custom Prototype(s) and/or Process(es).

Figure 1:
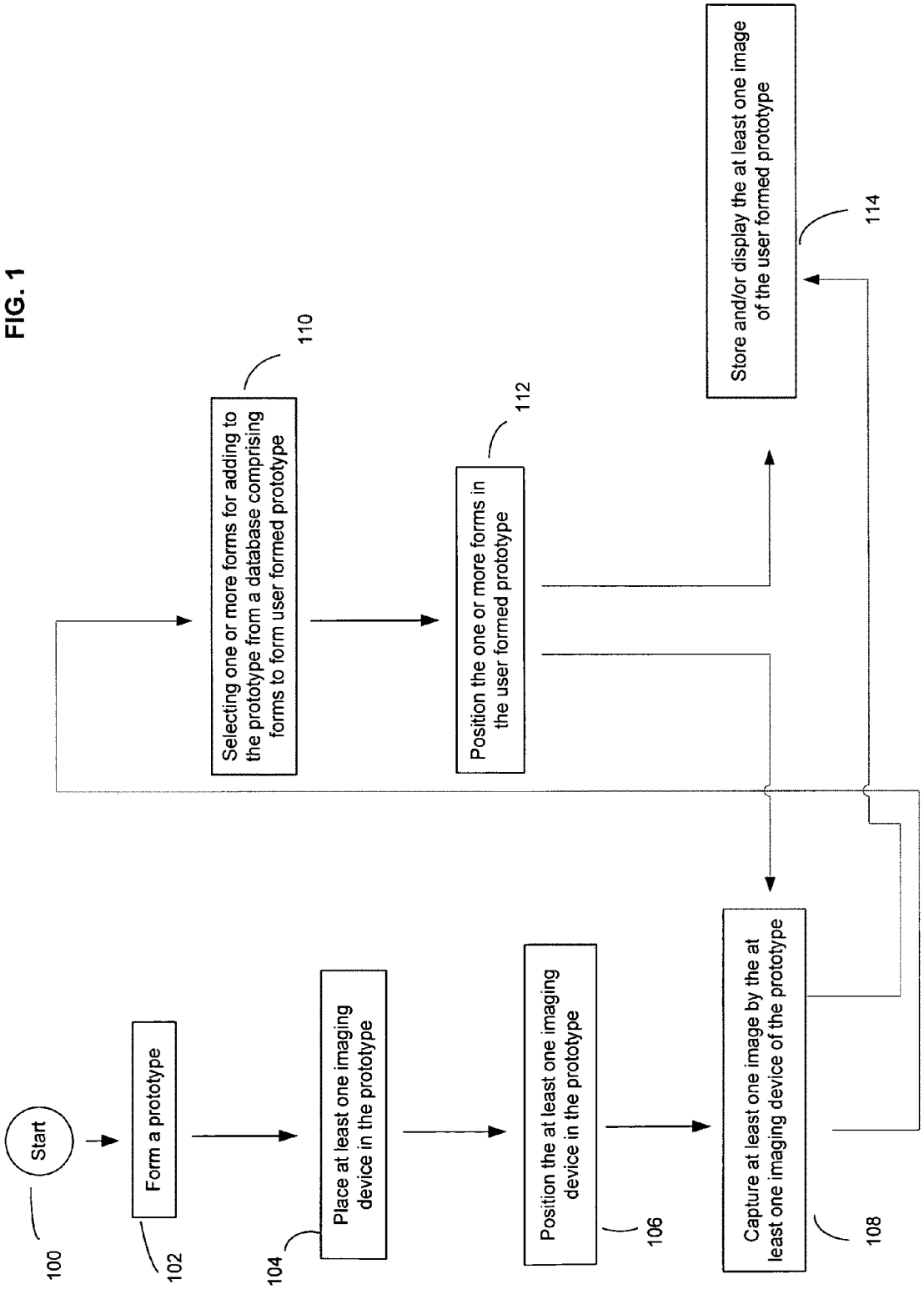
FIG. 1 depicts a logic flow chart of a process for making custom prototypes and/or operating a system for making custom prototypes.

With reference now to FIG. 1, shown is a logic flow chart illustrative of various exemplary methods of making a custom prototype(s) and/or designing process(es). Accordingly, the present application first describes an exemplary method of FIG. 1; thereafter, the present application illustrates certain exemplary structures. Those having skill in the art will appreciate that the specific devices and processes described herein are intended as merely illustrative of their more general counterparts.

A. Operation(s) and/or Process(es)

Figure 2:
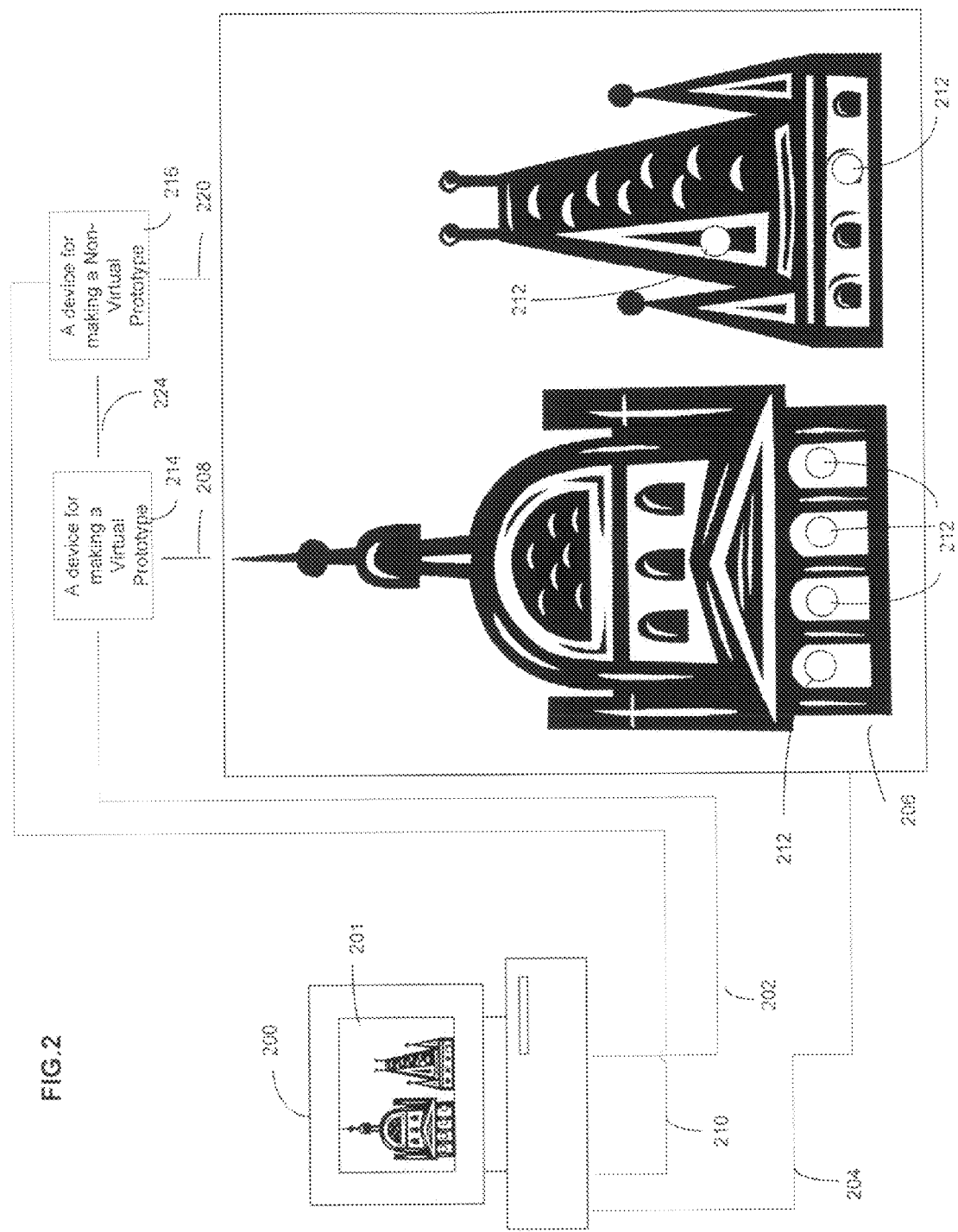
FIG. 2 is a plan view of one aspect of the system for making the custom prototypes 200.

With reference to the figures, and with reference now to FIG. 1 and with reference to FIG. 2, shown is a logic flowchart for operating a system for making custom prototypes 200. The logic flowchart provides an overall or "a big picture". Those having skill in the art will appreciate that the style of presentation utilized herein (e.g., beginning with a presentation of a flowchart presenting an overall view and thereafter providing the structure and/or devices generally allows for a rapid and efficient understanding of the various process instances).

Continuing to refer to FIG. 1, method step 100 depicts the start of the process. Method step 102 depicts the forming/making of a prototype. In one implementation, the prototype is a virtual prototype. In another implementation, the prototype is a non virtual prototype. In yet another implementation, the prototype is a combination of virtual and non-virtual components.

Continuing to refer to FIG. 1, method step 104 depicts placing of at least one imaging device in the prototype. The imaging device includes, and is not limited to, for example, an image capture device, such as, an optical capture device, a digital camera, or a video camera. The one or more imaging devices may be connected to the system for making custom prototypes 200 either individually, as a group, or in smaller sub-groups. In both implementations, the imaging devices can be independently operable or maneuvered.

Continuing to refer to FIG. 1, method step 106 depicts positioning or aligning the at least one imaging device in proximity to the prototype. In one implementation, this method step may be invoked to obtain a perspective view of the prototype. In another implementation, this method step may be invoked to locate or zoom in, for example, to discover a feature, a detail, or an item in proximity to the prototype. In another aspect positioning or aligning may allow the at least one imaging device to view information about surrounding features or objects, in addition to the prototype.

Continuing to refer to FIG. 1, method step 108 depicts capturing at least one image of the prototype by the at least one imaging device. In one implementation, the captured image may be stored for future manipulation. In another implementation, the captured image may be used to locate or provide a reference. Note that the use of the captured image refers generally to the prototype, but, is not necessarily limited to the prototype alone.

Continuing to refer to FIG. 1, method step 110 depicts the selection of one or more forms from a database comprising forms and adding the selected forms in proximity to the prototype making a user formed prototype. In one implementation, upon receiving the captured image, a user selects one or more forms from the database comprising forms for placement in proximity to the prototype. In another implementation, the user may select one or more forms from the database comprising forms to be placed in proximity to the prototype before method step 106. In this implementation, subsequent to the placement of one or more forms in proximity to the prototype the user may position or align the at least one imaging device.

Continuing to refer to FIG. 1, in one implementation, method step 110 includes a substep of making at least one of a user specified form by customizing the one or more forms or creating a new form according to user specifications. Customizing of the one or more forms, includes, and is not limited to, for example, creating new forms, changing the shape, dimension, color, texture, size or another feature of the one or more forms. In one example, the user may change the dimensions of a form, for example, a furniture item, to fit within the prototype, for example, where the prototype is of a house with a plurality of chambers. The forms include, and are not limited to, for example, items of furniture, art, decorations, books, apparel, foliage, or items specific to the prototype. For example, where the prototype is of a restaurant, the forms, include, and are not limited to, items present in a kitchen, items present in a bar, lights and other lighting accessories, or indoor ornaments, such as, restaurant logos and signs, an indoor fountain or other items.

Continuing to refer to FIG. 1, method step 112 includes positioning the one or more forms from the database comprising forms or the user specified form in proximity to the prototype. The positioning includes, and is not limited to, for example, aligning, moving, replacing, resizing the form to fit a criterion, or reshaping the form to fit a criterion.

Continuing to refer to FIG. 1, upon placing or positioning a user specified form or one or more forms from a database in proximity to the prototype, a user may capture an image with the imaging device as depicted in method step 108. The image of the formed prototype may be stored or displayed as depicted in method step 114. In one implementation the image captured may be stored for future manipulation. In another implementation the user may select additional forms from the database comprising forms, create new forms, reposition, resize, or reshape the forms. In another implementation the user may manipulate the prototype, for example, by specifying new dimensions, shape, color, or texture. It will be appreciated by those having skill in the art that the method for making custom prototypes includes, for example, and is not limited to, incorporating a plurality of characteristics consistent with manipulating, creating, changing, operating, moving, influencing, generating, or obtaining the forms and/or the prototype. It will also be appreciated by those skilled in the art that the changes to the characteristics of the forms or the prototype may be applied universally, individually, or in subsets by the user. In one implementation, changes within the subset may be applied by, for example, directing changes within a specified area or radius, directing changes to forms with a specified feature, or the like.

Described herein is an exemplary method for making custom prototypes. The user may choose to deviate from the logic flowchart of FIG. 1, for example, by skipping a method step or a substep, changing the order of the step or the substep, by adding a step or a substep, or by performing a step or substep simultaneously. It will be appreciated by those skilled in the art that a number of such permutations is likely and within the scope of the invention.

B. Structure(s) and or Device(s)

With reference now to FIG. 2, depicted is an aspect of the system for making custom prototypes 200 showing a user interface 201 in communication with a device for making a virtual prototype 214 and a device for making a non-virtual prototype 216. It will be appreciated by those skilled in the art that the type of device for making a non virtual prototype 216 is not critical to the invention and includes, for example, at least one device that forms a non-virtual prototype 206 comprising non-virtual components with a physical body of, such as, for example, ceramic, glass, polymer, plastic, wood, paper, laminate, metal, or composite. Similarly the device for making a virtual prototype 216 may comprise a computer and associated devices for generating or projecting a virtual prototype, a 3-D or 2-D projector, or a holographic projector. In one aspect the associated devices may include a holographic projector including a laser, hologram and related optics.

In one aspect the non-virtual prototype 206 is formed in part manually by the user. User input to make the prototype 206 is provided at the user interface 201, which communicates with the device for making the virtual prototype 214 and the device for making a non-virtual prototype 216, by communication lines 202 and 210, respectively, and the devices 214, 216 in turn communicate with the prototype 206 by communication lines 208 and 220, respectively. A communication line 224 provides a link between the device for making the virtual prototype 214 and the device for making a non-virtual prototype 216. Additionally, the user interface 201 maintains communication with the prototype 206 by a communication line 204. The communication lines 202, 210, 209, 220, 224, and 204 may be established physically or remotely, for example, wirelessly or non-wirelessly.

Continuing to refer to FIG. 2, in one aspect of the invention, user input is provided primarily at the user interface 201. In another approach of the invention, user input is provided at the user interface 201, the device for making a virtual prototype 214, and the device for making a non-virtual prototype 216. In yet another approach of the invention, user input is provided at the user interface 201, the device for making a virtual prototype 214, the device for making a non-virtual prototype 216, and at the prototype 206. In yet another approach of the invention, user input is provided at the user interface 201, and at the prototype 206. In this aspect, user input provided at the prototype 206 includes, and is not limited to, for example, moving or aligning one or more image capture devices 212, adjusting or positioning the one or more forms or the prototype 206.

Continuing to refer to FIG. 2, the one or more image capture devices 212 allows/promotes visualization of the prototype 206 and includes, but is not limited to, for example, an analog camera, a digital camera, an analog video camera, or a digital video camera. Operation of the one or more image capture devices 212 may be either remotely or manually. Manual operation of the image capture devices 212 includes, for example, user manipulation or manipulation by an individual responsive to user instructions whereas remote operation includes, for example, manipulation of the one or more image capture devices 212, wirelessly or non-wirelessly. Additionally, the image capture devices 212 may be manipulated at the user interface 201, or at other locations, such as, for example, at the device for making a virtual prototype 214, the device for making a non-virtual prototype 216 or at the prototype 206.

Continuing to refer to FIG. 2, the prototype 206 may include both virtual and non-virtual components. In one aspect of the invention, the prototype 206 includes a structure, or a structure at least partially enclosing at least one space, for example, a building construction, an interior of a room, a vehicle, a product body, or an animal body. In another aspect of the invention, the prototype 206 includes a plurality of parts, for example, a city, a landscape, an area, or a product body.

Figure 3:
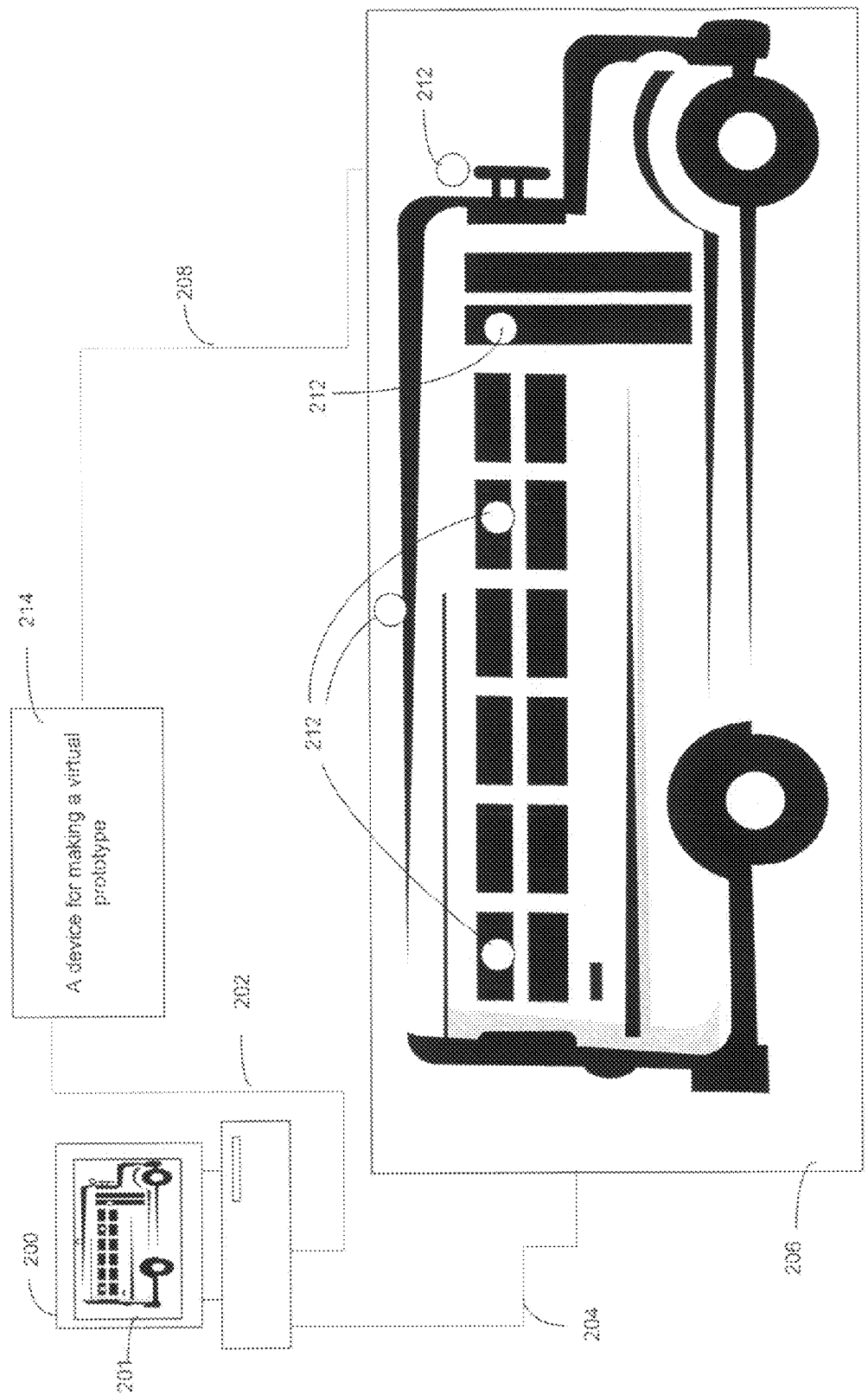
FIG. 3 is a plan view of another aspect of the system for making custom prototypes 200.

With reference now to FIG. 3, depicted is an aspect of the system for making custom prototypes 200 showing the user interface 201 in communication with the device for making the virtual prototype 214. In this aspect of the invention, the prototype 206 is of a vehicle which includes virtual components. For example, the prototype 206 is not necessarily limited to a single object. For example, the prototype 206 may also include the surrounding environment of the prototype 206, for example, a structure which houses the vehicle, or the like. Examples of the prototype 206 includes, but are not limited to, for example, a structure, an object, or a chamber. In this aspect of the invention, the one or more forms included in the database comprising forms are also of a virtual type. Examples of the one or more forms includes, and is not limited to, for example, a selection of plants, trees, furniture, household items, office items, items specific to the prototype 206, or items not specific to the prototype 206. In one approach the one or more forms are tagged for indexing, locating, moving, selecting, or positioning. In another approach, manipulation, positioning, or changing the one or more forms creates a differently tagged form.

Figure 4:
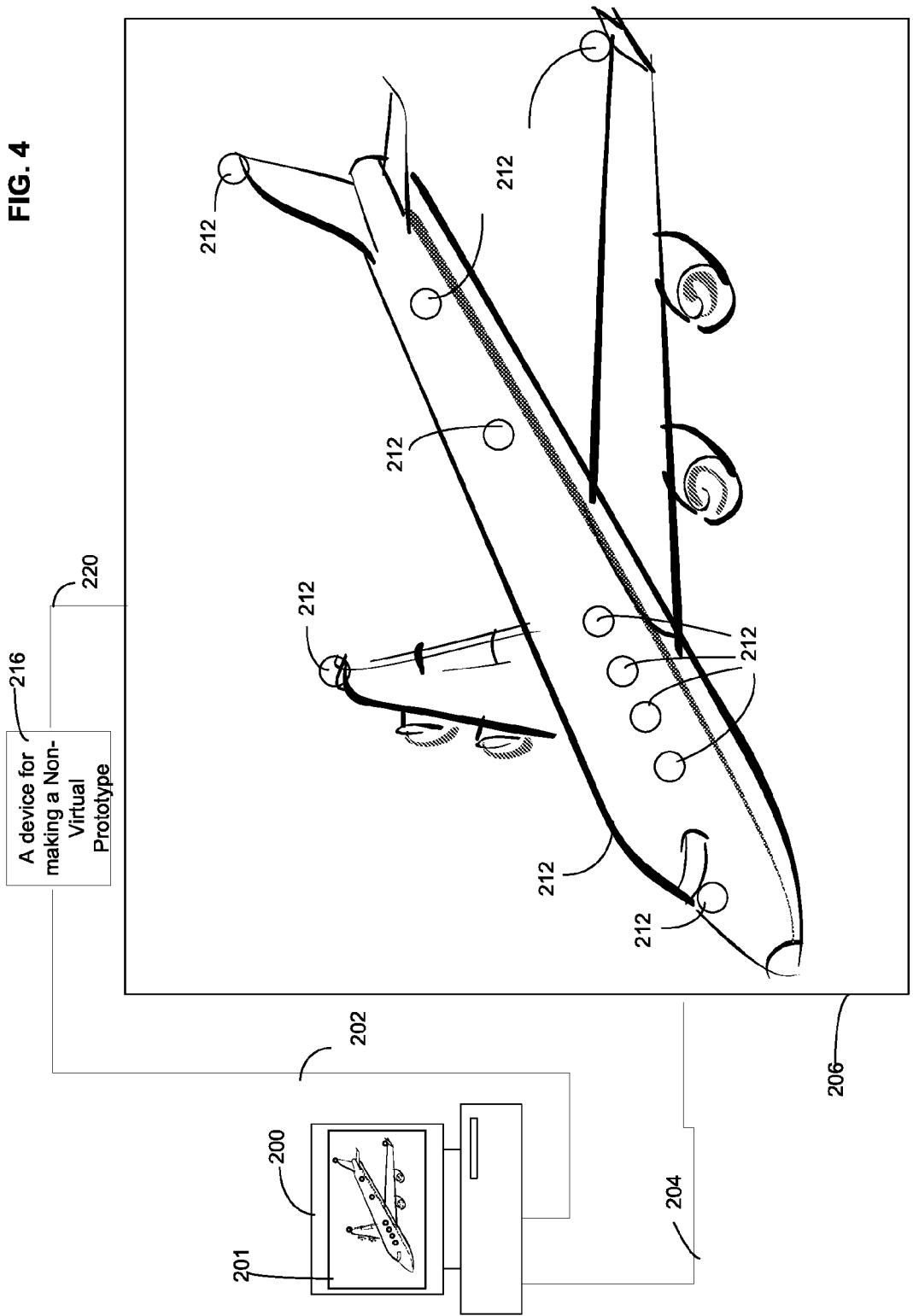
FIG. 4 is a plan view of another aspect of the system making custom prototypes 200.

With reference now to FIG. 4, depicted is an aspect of the system for making custom prototypes 200 showing the user interface 201 in communication with the device for making the non-virtual prototype 216. Examples of the prototype 206 include, but are not limited to, a structure, an object, or a chamber. In this aspect, the one or more forms included in the database comprising forms are also of a non-virtual type. Examples of the one or more forms includes, and is not limited to, for example, a selection of plants, trees, furniture, household items, office items, items specific to the prototype 206, or items not specific to the prototype 206. In one approach the one or more forms are tagged for the one or more forms are tagged for indexing, locating, moving, selecting, or positioning. Examples of the tag includes, but are not limited to, RFID tags, optically readable indicia or other interrogatable or viewable tags. The tags may uniquely identify the one or more forms, or may identify classes, types, or characteristics of the one or more forms. In another approach, manipulation, positioning, or changing the one or more forms produces a different tag or a modified tag, such as, for example, a different or modified RFID tag.

Forms may be manipulated by varying mechanisms. For example, a motor or an actuator may be coupled to one or more forms to permit their manipulation. Additionally, a magnetic piece may be coupled to or embedded in the one or more forms and a magnetic manipulator used to manipulate the one or more forms. The system for making the custom prototype 200 permits the manipulation, positioning, or changing the one or more forms, or the prototype 206 wirelessly, for example, by an antenna, or non-wirelessly.

Figure 5:
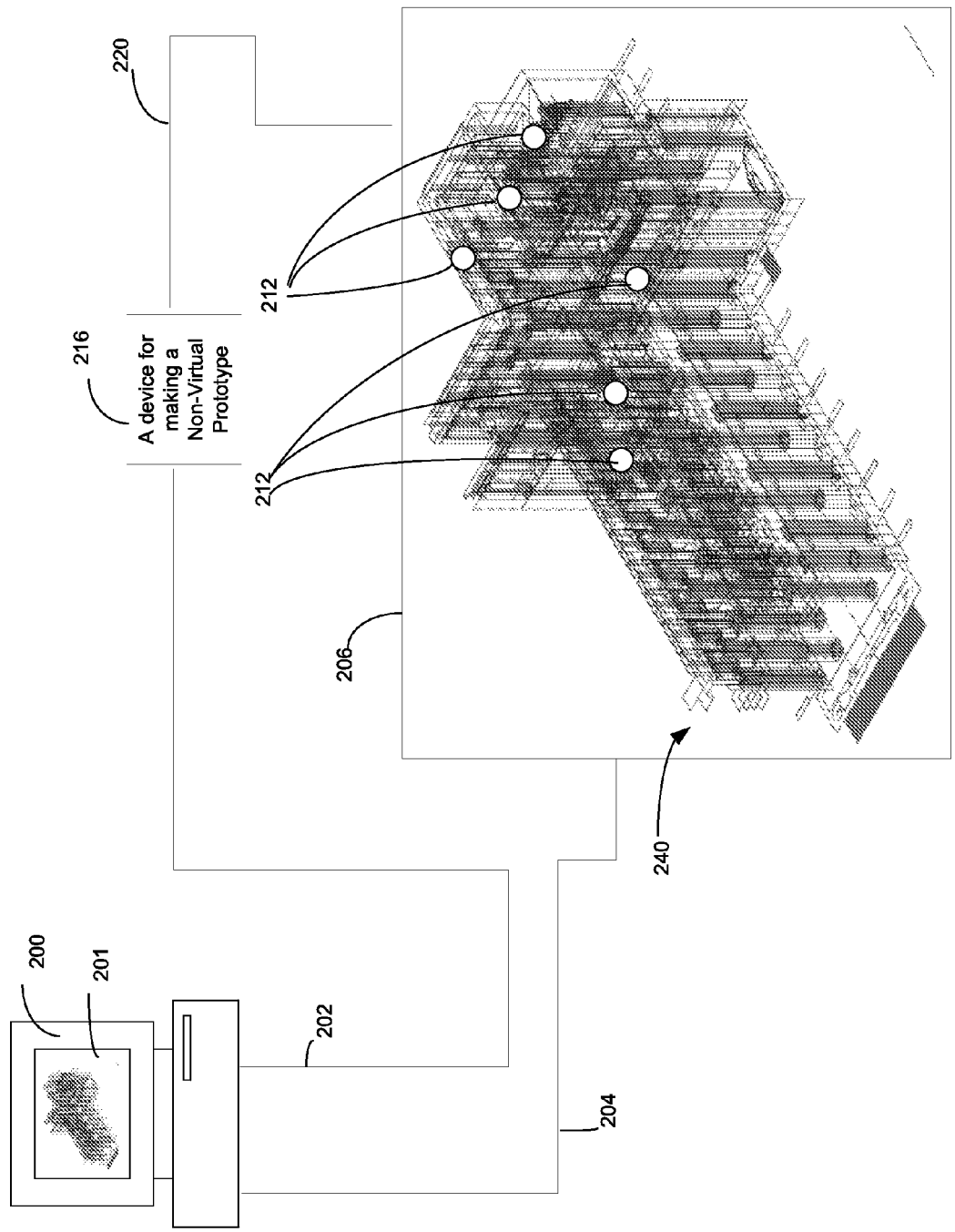
FIG. 5 is a plan view of another aspect of the system for making custom prototypes 200.

Referring now to FIG. 5, depicted is an aspect of the system for making custom prototypes 200 showing the user interface 201 in communication with the device for making the non-virtual prototype 216. The prototype 206 depicts a chamber wherein the choice of objects 240 are dependant on the specific prototype. For example, where the prototype 206 depicts an event venue, the choice of objects 240 includes, and is not limited to, for example, seats, lights, tables, art work, staging, decorations, or the like. In this example, the image capture devices 212 are mounted as an array and camouflaged as part of the lighting system.

With reference now to FIG. 6, depicted is an aspect of the system for making custom prototypes 200 showing the user interface 201 in communication with the device for making the virtual prototype 214. The prototype 206 depicts a chamber wherein the choice of objects 240 are dependant on the specific prototype. For example, where the prototype 206 depicts an event venue, the choice of objects 240 includes, and is not limited to, for example, seats, lights, tables, art work, staging, decorations or the like.

It will be appreciated by those skilled in the art that the system for making custom prototypes 200 may include all the components, hardware, software, firmware, circuitry, and logic for performing the steps and substeps disclosed herein. For example, the system for making custom prototypes 200, includes a work station with the user interface 201. In this example, the work station includes a processor, coupled to a memory, and a storage medium of suitable size. A software program providing instructions may be stored in the memory to control the devices in communication or to store the information obtained. Additionally, the work station or the user interface 201 may be coupled to additional components for system integrated digital data gathering, processing, storage, compression and transmission. Data may be compressed and stored in the storage medium or transferred to a computer readable or recordable format. Examples of such computer readable or recordable format includes, and is not limited to, floppy disks, hard disk drives, CD ROMs, digital tape, computer memory digital or analog communication links using TDM or IP based communication links (e.g., packet links).

C. Variation(s), and/or Implementation(s)

Those having skill in the art will recognize that the present application teaches modifications of the system, devices, structures, and/or processes within the spirit of the teaching herein. For example, the system for making custom prototypes 200 need not be limited to a static prototype. In one example, the prototype 206 includes a dynamic prototype or a real-time prototype wherein the prototype 206 changes responsive to predefined user or environmental cues or rules. For example, the user may specify a rule or a condition, which may be tracked, for example, by a sensor. In such an example, the prototype 206 provides a model, wherein one or more responses are tracked within the prototype when the rule or condition is met. It will be appreciated by those skilled in the art that the components, circuitry, software, hardware, firmware, or logic for making such a prototype 206 is within the spirit of the invention. Example of such a dynamic prototype, includes, for example, forming a prototype of a plurality of structures scattered in an area. The area may be subject to an environmental condition or event, such as, for example, flooding, or earthquakes. In such an example, the release of the environmental condition may be tracked by sensors, an alerting system may notify the user of the event, and subsequent to the occurrence of the event the user may respond by strengthening or changing the structures and studying the response of the prototype 206. Other modifications of the subject matter herein will be appreciated by one of skill in the art in light of the teachings herein.

It will be appreciated by those skilled in the art that the present application teaches a system and a method for making the custom prototype 206 is not limited to a new or user formed prototype. The custom prototype 206 may include, for example, and is not be limited to a commercial prototypes, generic prototypes, or patented prototypes. The custom prototype 206 may be made by commercial or patented techniques or methods known in the art. Examples of such prototypes, techniques, or methods are disclosed and incorporated herein by reference; U.S. Pat. Nos. 6,623,687, 5,684,713, 5,109,589, and 4,929,402, and US patent application numbers US 20020186216A1, and 20030218607A1. Other modifications of the subject matter herein will be appreciated by one of skill in the art in light of the teachings herein.

It will also be appreciated by those skilled in the art that the visualization of the custom prototype 206 can be in real-time continuous mode or in a real-time freeze capture mode. Furthermore, in one exemplary aspect of the invention, the user may choose to operate the image capture device 212 manually. For example, the user may choose to hold, position, reposition, or direct the image capture device 212. Other modifications of the subject matter herein will be appreciated by one of skill in the art in light of the teachings herein.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While particular aspects of the present subject matter described herein have been shown and described, it will be obvious to those skilled in the art that, based upon the teachings herein, changes and modifications may be made without departing from this subject matter described herein and its broader aspects and, therefore, the appended claims are to encompass within their scope all such changes and modifications as are within the true spirit and scope of this subject matter described herein. Furthermore, it is to be understood that the invention is defined solely by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations), etc.

The invention claimed is:

1. A system, comprising:
control electronics including a memory containing a plurality of data sets representing design items;
a user interface coupled to the control electronics and operative to select one or more of the data sets representing design items and operative to receive one or more user view selections;
a rapid prototyping device coupled to the control electronics and responsive to a selection of one or more data sets representing design items to produce physical items;
a positioning mechanism operable to accept physical items produced by the rapid prototyping device and to position the physical items produced by the rapid prototyping device in a field; and
an image capture device coupled to the control electronics and responsive to the one or more user view selections to selectively image at least a portion of the field corresponding to at least one received user view selection.

2. The system of claim 1 wherein the image capture device includes a camera.

3. The system of claim 1 wherein the rapid prototyping device is operable to produce physical items including a magnetically responsive material and wherein the positioning mechanism includes an electromagnet.

4. The system of claim 1 further including a display positioned for viewing by a user and operable to present an image corresponding to the portion of the field corresponding to the received user view selection.

5. The system of claim 4 further including display electronics operable to superimpose a virtual image portion on the image corresponding to portion of the field corresponding to the received user view fewer selection a virtual image portion.

6. The system of claim 5 wherein the display electronics includes a holographic projector.

7. The system of claim 1 wherein the image capture device responsive to the received user view selections electronics to selectively image at least a portion of the field corresponding to the received user view selection is operable to selectively image the at least a portion of the field from a plurality of orientations.

8. The system of claim 1 further including:
a user control responsive to the received user view selection to change from a first of the plurality of orientations to a second of the plurality of orientations.

9. A computer-implemented method comprising:
selecting one or more data sets representing one or more design items;
receiving at least one user view selection;
producing one or more physical items via rapid prototyping in response to the selection of one or more data sets representing one or more design items;
positioning the one or more physical items in a field; and
imaging at least a portion of the field according to the user view selection.

* * * * *

UNITED STATES PATENT AND TRADEMARK OFFICE
CERTIFICATE OF CORRECTION

| | | |
|---|---|---|
| PATENT NO. | : 8,260,448 B2 | Page 1 of 1 |
| APPLICATION NO. | : 12/592217 | |
| DATED | : September 4, 2012 | |
| INVENTOR(S) | : Bran Ferren | |

It is certified that error appears in the above-identified patent and that said Letters Patent is hereby corrected as shown below:

In the Claims:

Column 10 Line 36-37: add "a" before the word "portion" and delete "fewer" and "a virtual image portion".

Column 10 Line 41: delete "selections" and insert --selection-- and delete "electronics".

Column 10 Lines 47-49: after first of delete "the" and insert --a-- and after second of delete "the" and insert --a--.

Signed and Sealed this
Twenty-eighth Day of May, 2013

Teresa Stanek Rea
*Acting Director of the United States Patent and Trademark Office*